US006475684B2

(12) United States Patent
Ki

(10) Patent No.: US 6,475,684 B2
(45) Date of Patent: Nov. 5, 2002

(54) METHOD OF CORRECTING LINE WIDTH VARIATION DUE TO LOADING EFFECT CAUSED DURING ETCHING OF A PHOTOMASK AND RECORDING MEDIUM FORMED ACCORDING TO THE METHOD

(75) Inventor: Won-tai Ki, Seoul (KR)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 09/839,189

(22) Filed: Apr. 19, 2001

(65) Prior Publication Data

US 2002/0051916 A1 May 2, 2002

(30) Foreign Application Priority Data

Sep. 27, 2000 (KR) ........................................ 2000-56714

(51) Int. Cl.[7] .............................. G03F 9/00; G03C 5/00
(52) U.S. Cl. ......................... 430/30; 430/296; 430/942
(58) Field of Search ........................... 430/30, 296, 942

(56) References Cited

U.S. PATENT DOCUMENTS 6,361,911 B1 * 3/2002 Tsai et al. ..................... 430/30

FOREIGN PATENT DOCUMENTS

JP         10010701       1/1998

OTHER PUBLICATIONS

Microprocessor and Nanotechnology 2000, 2000 International Microprocesses and Nanotechnology Conference, "A New Correction Method for Dry Etch Loading Effect in Photomask Fabrication", Jul. 11, 2000, pp. 42–43.

* cited by examiner

Primary Examiner—Christopher G. Young
(74) Attorney, Agent, or Firm—Mills & Onello, LLP

(57) ABSTRACT

A method of exposing a photomask substrate, provides an exposing method for correcting a loading effect generated when a photomask substrate is dry etched. Accordingly, a variation in line width caused by a loading effect generated due to the non-uniformity of a loading density is reduced by a method of performing correction exposure using a dose corresponding to the loading effect due to a desired pattern which is calculated from a relationship represented as the convolution of a Gaussian distribution and a loading density.

15 Claims, 9 Drawing Sheets

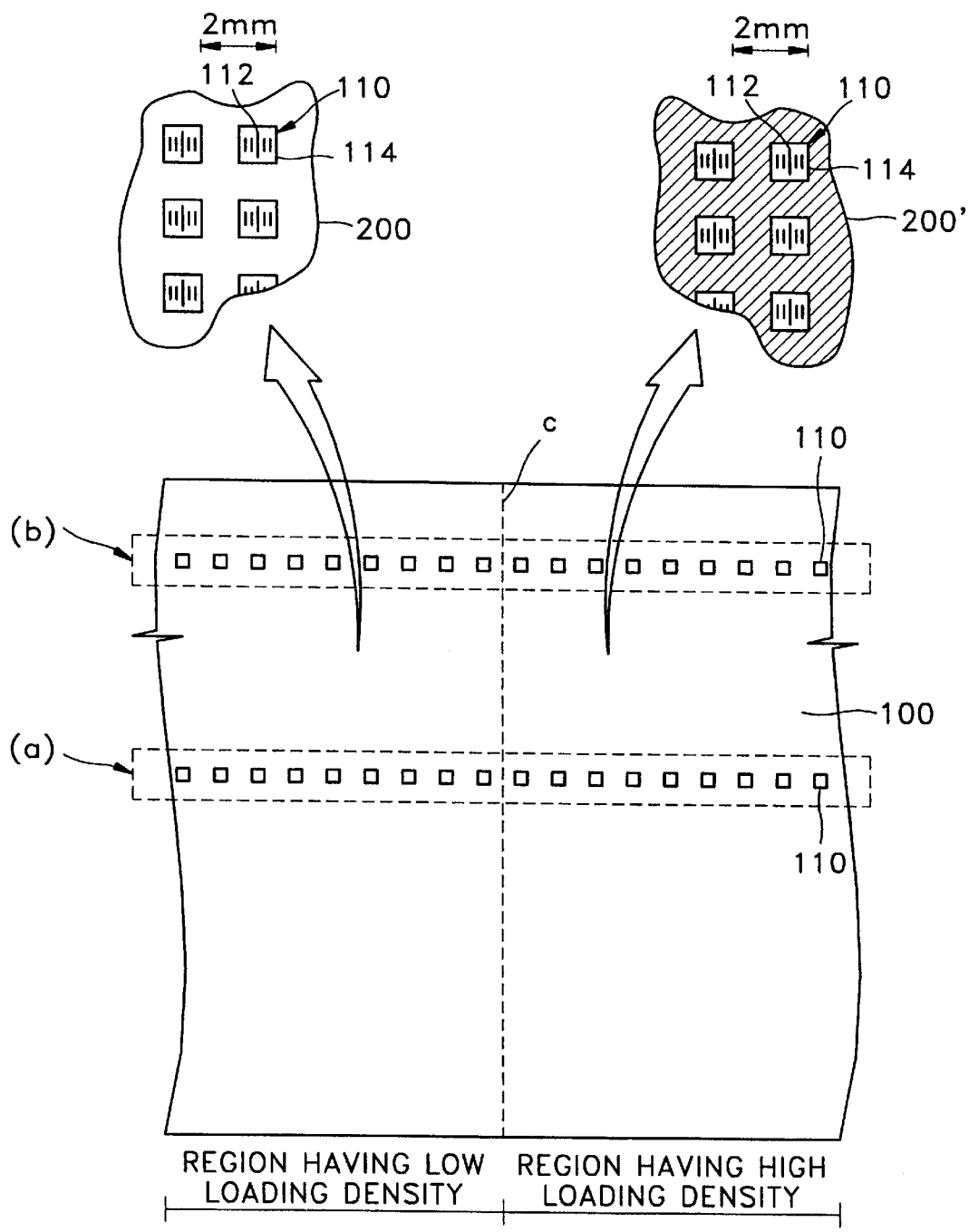

METHOD OF CORRECTING LINE WIDTH VARIATION DUE TO LOADING EFFECT CAUSED DURING ETCHING OF A PHOTOMASK AND RECORDING MEDIUM FORMED ACCORDING TO THE METHOD

BACKGROUND OF THE INVENTION

1. Field of the Invention

The present invention relates to a method of exposing resist on a photomask substrate used in the manufacture of semiconductor devices, and more particularly, to an exposing method for correcting a loading effect caused when a photomask substrate is dry-etched, and a recording medium formed according to the exposing method.

2. Description of the Related Art

A loading effect generally denotes a reduction in etch rate due to a shortage of an etch solution or etch gas which reacts with a substrate.

The types of loading effects include a micro loading effect and a macro loading effect. A micro loading effect denotes a variation in etch rate due to a failure in supplying an etch gas to a deep portion of an etch pattern as the aspect ratio of the etch pattern increases. A macro loading effect denotes a variation in etch rate with respect to the density of etch patterns formed on the periphery of another etch pattern.

According to the macro loading effect, when an electron beam resist film previously formed on a photomask substrate is removed, whether it is a positive- or negative-type film, the line width of an opaque layer below the electron beam resist film varies according to the density of an exposed area of the opaque layer (hereinafter, referred to as a "loading density") in a subsequent process for etching the opaque layer. The line width of a portion of the opaque layer having a high loading density is larger than that of a portion of the opaque layer having a low loading density. The above fact can be explained in terms of the etch rate of the opaque layer and the erosion rate of the electron beam resist film. In the high loading density region, the etch rate of the opaque layer decreases, but the erosion rate of the electron beam resist film increases, so that the line width increases compared to that in the low loading density region. Thus, the loading effect can vary depending on the material type of an electron beam resist film.

The line width variation due to the loading effect caused upon dry etching can be largely corrected by adjustment of an etching condition or by exposure with an additional compensation dose. A method of adjusting the etching conditions by additionally introducing a hydrochloric acid gas during dry etching has been suggested as an example of the former. However, this method is not an acceptable solution, since it causes generation of defects, distortion of line width and the like. An example of the latter, compensation dose, method is disclosed in Japanese Patent Publication No. Hei 10-10701. This method provides a correction dose upon exposure in order to obtain a desired pattern by experimentally obtaining the relationships between the line width difference and the correction exposure dose according to the density of the pattern (loading density) and by storing the obtained relationships in a database. However, a drawback with this approach is that it requires an excessive number of experiments in order to accumulate data on various-sized line widths of a desired pattern.

SUMMARY OF THE INVENTION

The present invention relates to a method of correcting the aforementioned macro loading effect caused by dry etching.

To address the above limitations of the conventional approaches, it is an object of the present invention to provide a method for correcting line width variation due to a loading effect by correction exposure.

Accordingly, to achieve the above object, there is provided a method of correcting a variation in line width due to a loading effect generated when the material layer on a photomask substrate is dry-etched to have a desired pattern, in which, first, a loading effect range δ is obtained by dividing the substrate into meshes, and supposing the distribution of a loading effect frequency $f_L$ representing the degree of a loading effect at an arbitrary mesh on the substrate from each of the meshes to be a Gaussian distribution expressed in the following equation:

$$f_L(r) = \frac{k}{\pi \delta^2} \cdot \exp\left[-\frac{r^2}{\delta^2}\right]$$

wherein r denotes the distance between the arbitrary mesh and each of the other meshes, and k denotes a loading constant. Next, the loading density of the desired pattern, which is defined as a ratio of the area to be etched to the entire area in each mesh, is calculated. The loading effect at each of the meshes on the substrate can be calculated by convoluting the loading density of the desired pattern and the loading effect frequency obtained from the loading effect range. An electron beam resist is correction-exposed according to the loading effect calculated at each of the meshes on the substrate. In this way, a variation in line with is corrected. The loading effect L can be calculated from the following equation:

$$L(x, y) = \sum_{i,j} D(i, j) \cdot \exp\left[-\frac{(x-i)^2 + (y-j)^2}{\delta^2}\right]$$

wherein x,y denotes the coordinate of the arbitrary mesh, and D(i,j) denotes the loading density of the test patterns in a mesh having a coordinate (i,j).

The step of obtaining a loading effect range can include the step of forming test patterns by exposing, developing and etching a photomask substrate, and measuring the line width of the test pattern, and the step of calculating the loading effect expressed as the above-described equation an arbitrary loading effect range value, comparing the loading effects with the line widths of the test pattern at the meshes, and selecting a loading effect range in which the deviation between them is minimum. In the above equation, the loading density of test patterns is defined as a ratio of an area to be etched to the entire area of each mesh.

To achieve the second object, there is provided a recording medium readable by a computer which records a method of correcting a variation in line width. The recording medium includes a program module for obtaining a loading effect range δ by dividing a predetermined pattern into meshes, calculating a loading effect L for each of the meshes with respect to arbitrary loading effect range values δ, and comparing the loading effect with a given line width, the loading effect L expressed as in the following equation:

$$L(x, y) = \sum_{i,j} D(i, j) \cdot \exp\left[-\frac{(x-i)^2 + (y-j)^2}{\delta^2}\right]$$

wherein x,y denotes the coordinate of an arbitrary mesh, and D(i,j) denotes the loading density of the patterns in a mesh having a coordinate (i,j).

The recording medium also includes a program module for calculating the loading density of the desired pattern, which is defined as a ratio of the area to be etched to the entire area of each mesh, a program module for receiving the loading effect range δ and data of the loading density of the desired patterns and calculating the loading effect L of the desired pattern loaded on each of the meshes using the above equation for obtaining a loading effect, and a program module for calculating a correction-exposing dose for each of the meshes from the loading effect of the desired pattern.

According to the present invention, a line width variation due to a loading effect caused by the non-uniformity of a loading density can be reduced by a correction exposing method using a dose corresponding to a loading effect received from a desired pattern, the loading effect calculated from an equation expressed as the convolution of a Gaussian distribution and a loading density.

Also, the correction exposing method can be performed using a computer program, so that the calculation can be simply performed. Furthermore, the computer program can be loaded in exposing equipment, so that correction-exposing can be easily performed using the calculated values.

BRIEF DESCRIPTION OF THE DRAWINGS

The above objectives and advantages of the present invention will become more apparent by describing in detail a preferred embodiment thereof with reference to the attached drawings in which:

FIGS. 4A and 4B show a test pattern used in an embodiment to obtain a loading effect range of the present invention, and a plurality of the test patterns aligned on a photomask substrate, respectively;

DETAILED DESCRIPTION OF PREFERRED EMBODIMENTS

Figure 1:
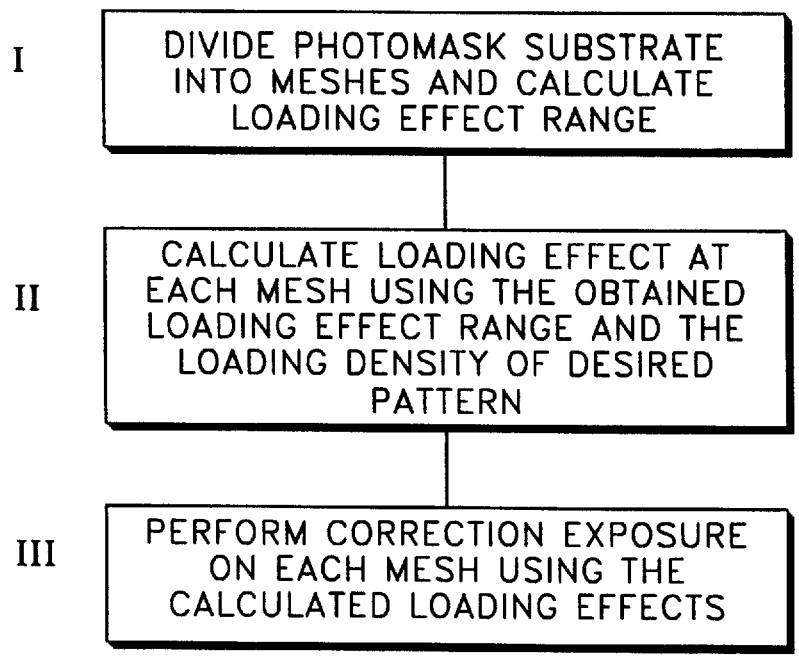
FIG. 1 is a flowchart illustrating the sequence of correcting a line width variation due to a loading effect, according to an embodiment of the present invention.

Hereinafter, the present invention will be described in detail with reference to the attached drawings. An embodiment of the present invention to be described can be modified into various other forms, and the scope of the present invention should not be interpreted as being restricted to the embodiment. The embodiment is provided to more completely explain the present invention to those skilled in the art. Like reference numerals in the drawings denote the same members.

The present embodiment relates to a method of correcting for line width variation due to a loading effect caused while a material layer on a photomask substrate, for example, a opaque layer, is dry-etched into a desired pattern.

FIG. 1 is a flowchart illustrating the sequence of correcting line width variation generated due to a loading effect, according to an embodiment of the present invention. A correction method according to the present embodiment will now be described with reference to FIG. 1.

Step I

Figure 2:
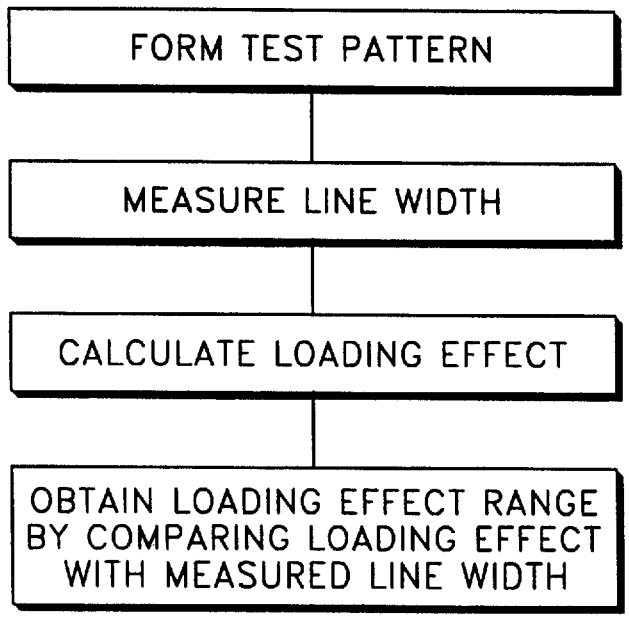
FIG. 2 is a flowchart illustrating the sequence of obtaining a loading effect range, according to an embodiment of the present invention.

Referring to FIG. 1, first, the range of loading effect generated when a opaque layer on a substrate is etched is calculated. The term "loading effect range" as used in the description of the present invention does not denote a physical limit within which a loading effect is generated, but rather relates to a loading effect range given according to a relationship to be described later. The step of calculating the loading effect range includes the following sub-steps. FIG. 2 illustrates the sequential steps for obtaining a loading effect range.

Referring to FIG. 2, the step of calculating a loading effect range includes the substeps of: dividing a photomask substrate into meshes and forming a test pattern on the photomask substrate to measure a variation in the line width of the test pattern; measuring the line width of the test pattern; and obtaining the loading effect range by comparing the measured line width of the test pattern with a loading effect L in each of the meshes calculated from Equation 1:

$$L(x, y) = \sum_{i,j} D(i, j) \cdot \exp\left[-\frac{(x-i)^2 + (y-j)^2}{\delta^2}\right] \tag{1}$$

wherein x,y is a coordinate of each of the meshes on a photomask substrate, D(i,j) denotes loading density in a mesh of a coordinate (i,j), and δ denotes loading effect range. The loading density denotes the area of a portion to be etched with respect to the area of each mesh.

The meaning of Equation 1 will now be described. In the present invention, a loading effect at an arbitrary location, or spot, on a substrate from a pattern formed on all spots on the substrate may decrease exponentially with respect to distance. Thus, a loading effect frequency $f_L$ representing the degree of the loading effect is quantified as having a Gauss distribution and can be expressed in Equation 2:

$$f_L(r) = \frac{k}{\pi\delta^2} \cdot \exp\left[-\frac{r^2}{\delta^2}\right] \qquad (2)$$

wherein k denotes a loading constant, r denotes a distance from the arbitrary spot on the substrate, and δ denotes a loading effect range.

Figure 3:
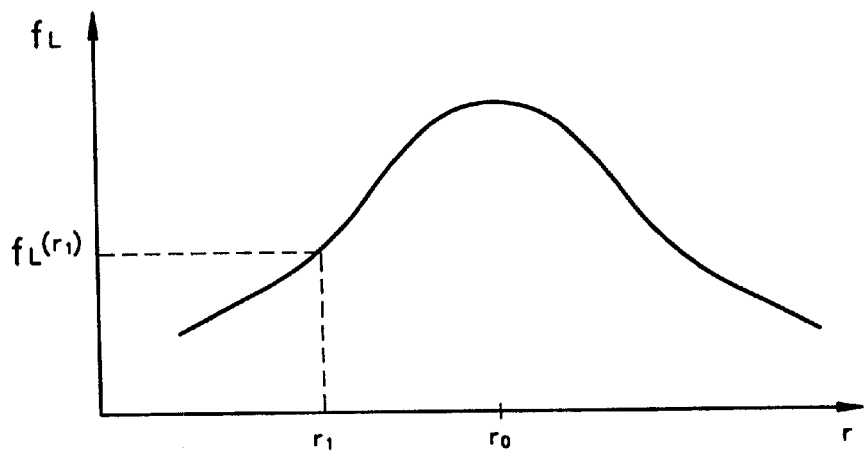
FIG. 3 is a graph showing the frequency of loading effects received from all regions of a photomask substrate at an arbitrary spot of the substrate, with respect to the distance between the arbitrary spot and each of the other spots.

That is, the loading effect frequency in Equation 2 forms a graph with respect to r as shown in FIG. 3. Referring to FIG. 3, a loading effect frequency denoting the degree of a loading effect at an arbitrary spot $r_0$ on a substrate from another spot, for example, $r_1$, is $f_L(r_1)$, and a loading effect frequency at an arbitrary spot $r_0$ on a substrate from another spot on the substrate decreases exponentially as the distance between the arbitrary spot and the other spots increases.

Accordingly, a loading effect due to a pattern formed at a spot on a substrate with respect to a different particular spot on the substrate is proportional to the product of the loading density at the former spot on the substrate and the loading effect frequency ranging from the former spot to the latter particular spot. Hence, loading effects at the particular spot on the substrate from all spots on the substrate can be expressed as the convolution of the loading density and the loading effect frequency at each spot. Therefore, considering the coordinate of each spot on the substrate, a loading effect can be expressed as in Equation 1.

Figure 4A:
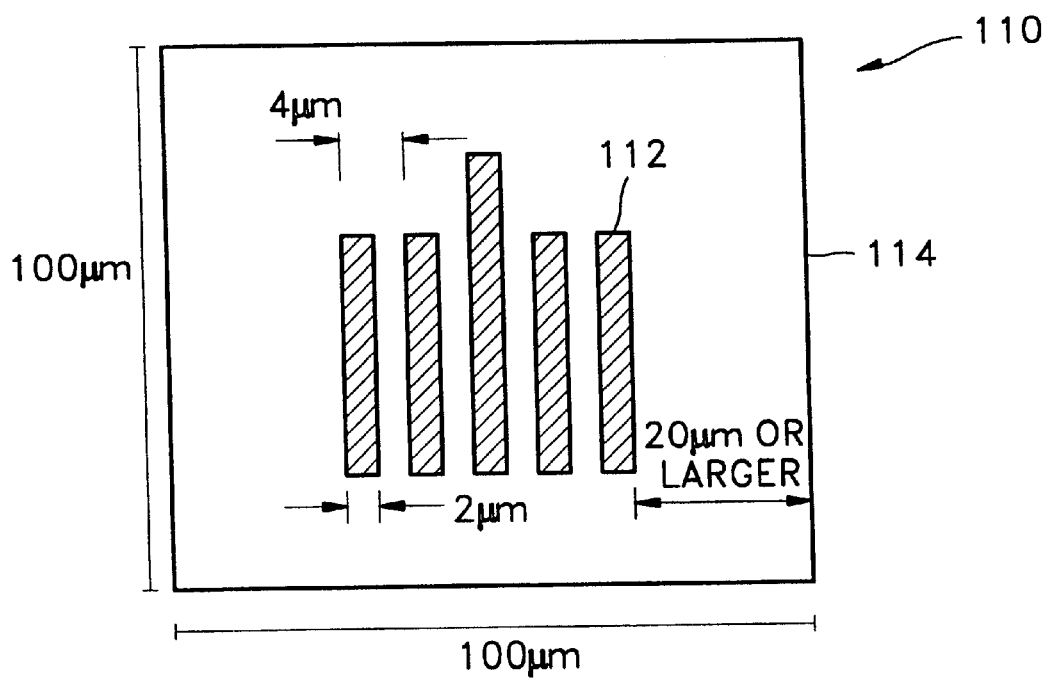

Hereinafter, an example for detailing the aforementioned steps for obtaining a loading effect range δ is provided. FIG. 4A shows a test pattern used in an embodiment of the present invention. As shown in FIG. 4A, a test pattern 110 includes basic patterns 112 which have line widths of 2 μm and are aligned at intervals of 4 μm, and a frame 114 for surrounding the basic patterns 112. The frame 114 has a shape of a square having 100 μm sides. The basic patterns are aligned so that a basic pattern 112 closest to the frame 114 is spaced at least 20 μm apart from the frame 114. The basic patterns 112 of the test pattern 110 are portions, the line widths of which are to be measured by a subsequent process.

FIG. 4B shows a photomask substrate 100 on which the test patterns 110 are aligned, and magnifications 200 and 200' of some portions of the substrate. As shown in FIG. 4B, test patterns 110 to be exposed are two-dimensionally arranged at intervals of 2 mm on the photomask substrate 100. Referring to the magnifications 200 and 200', at the right side on the basis of the very middle (c) of the photomask substrate 100, not only portions confined by the basic patterns 112 but also the portions at the outer side of the frame 114 are etched. Here, the exposed portions are hatched in FIG. 4B. On the other hand, at the left side, only portions confined by the basic patterns 112 are etched. Since the basic patterns 112 occupy very small areas on the photomask substrate 100, the right side of the photomask substrate 100 has a very high loading density, and the left portion of the photomask substrate 100 has a very low loading density.

Though the above-described test patterns 110 and the arrangement of the test patterns are relatively simple, the present invention is not restricted to the test patterns and the test pattern arrangement mentioned in this embodiment, and can be applied to various types of test patterns and test pattern arrangements.

The resist on the photomask substrate 100 is exposed to light, developed and etched according to the arrangement of the test patterns 110 described referring to FIGS. 4A and 4B. Then, the line widths of the basic patterns 112 are measured. Here, the photomask substrate 100 is a typical photomask substrate obtained by coating a quartz substrate with an opaque layer (not shown) and a photoresist film (not shown). A photomask substrate is generally coated with an electron beam resist film. However, in the present embodiment, a photoresist film is coated instead of an electron beam resist film and exposed to laser beams, since when an electron beam resist film is exposed, the line width of an actually-formed pattern changes due to re-scattering of the electron beam.

Figure 5:
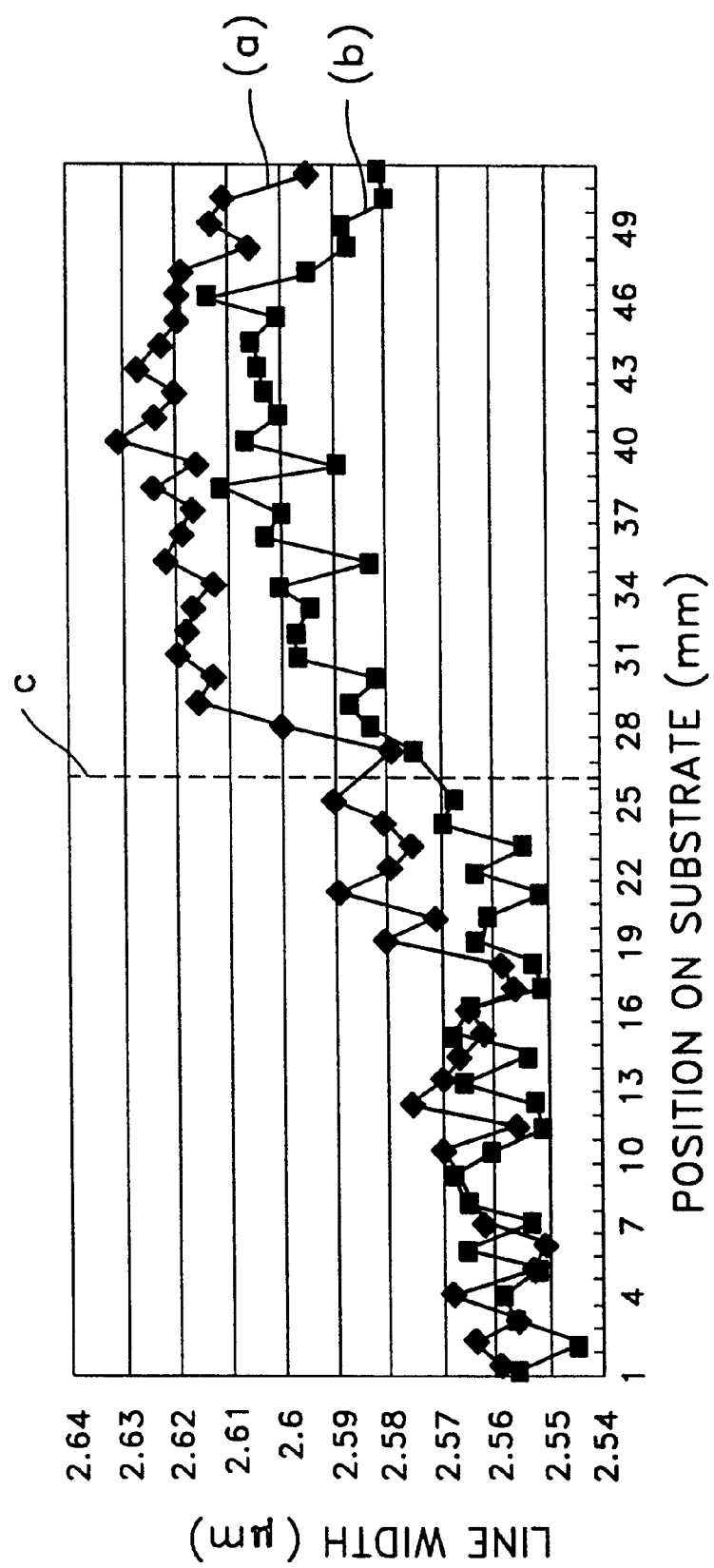
FIG. 5 is a graph showing variations in the line width of patterns formed by exposing, developing and etching a resist on the photomask substrate to obtain a loading effect range according to an embodiment of the present invention.

FIG. 5 is a graph showing variations in the line width of patterns formed by exposing and developing the resist film on the photomask substrate and etching the opaque layer on the photomask substrate according to the arrangement of the test patterns of FIGS. 4A and 4B. The line width is an average value measured by meshes into which a photomask substrate is divided. In this embodiment, square meshes each having 1 mm sides are used. The size of the mesh is set in consideration of the size of a line width to be measured, the size of a loading effect range to be calculated, and the like. In FIG. 5, the graph indicated by reference character (a) shows the line widths of the test patterns aligned along row (a) at the center of the substrate, and the graph indicated by reference character (b) shows the line widths of the test patterns aligned along row (b) at the edge of the substrate. It can be seen from FIG. 5 that the line widths of test patterns at a region having a high loading density (at the right area of a photomask substrate) based on the very middle (c) of the substrate are greater than those at a region having a low loading density (at the left area of the photomask substrate). Also, it becomes evident that the line widths of patterns aligned along a row at the center of the substrate are greater than those aligned along a row at the edge of the substrate. This means that, as in the description of a macro loading effect, a large loading effect is shown at the center of the substrate having many peripheral patterns, while a small loading effect is shown at the edge of the substrate having a small number of peripheral patterns.

A loading effect range can be obtained from the actually-measured line width data described above. To be more specific, a loading effect range can be obtained by comparing the real line width data with a loading effect calculated by substituting the loading density at each mesh and the distance between meshes in Equation 1.

Figure 6A:
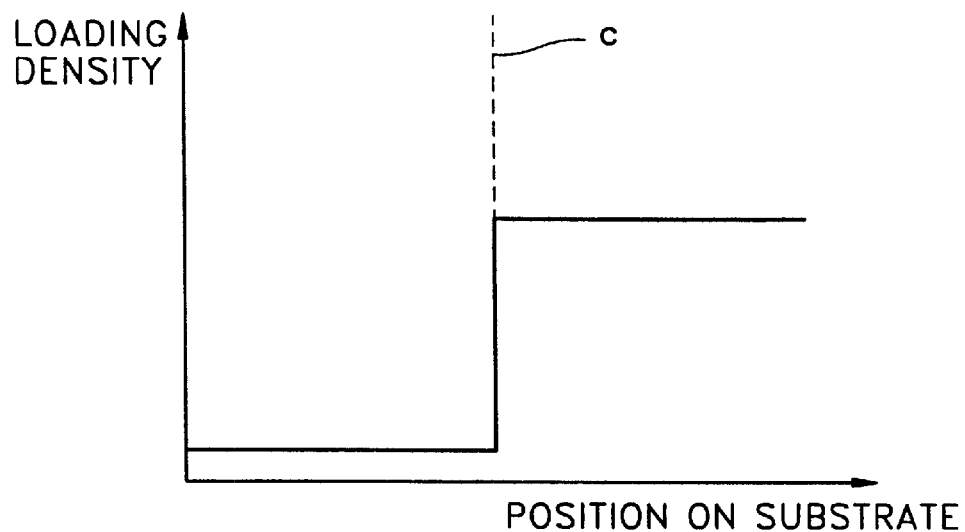
FIGS. 6A and 6B are graphs schematically showing a variation in loading density and a variation in calculated loading effect to obtain a loading effect range, respectively, with respect to mesh according to an embodiment of the present invention.
Figure 6B:
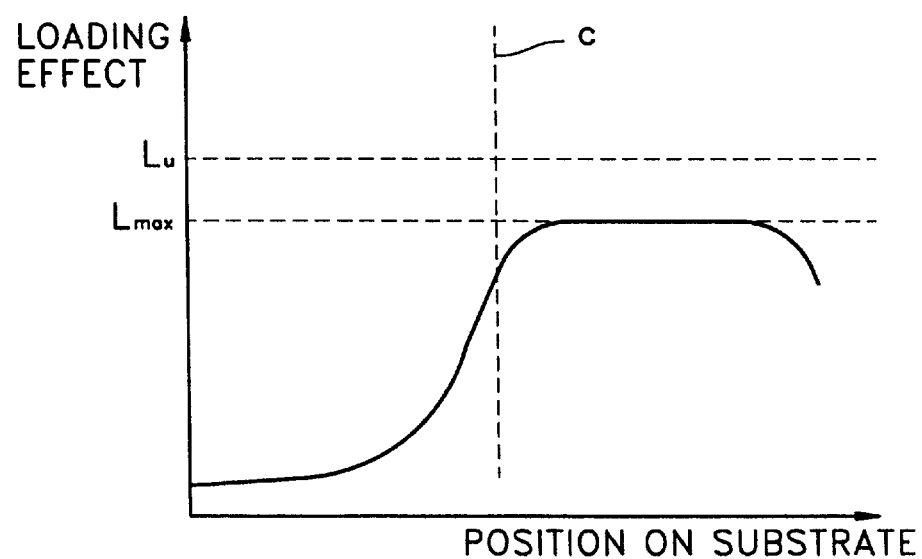

FIGS. 6A and 6B are graphs schematically showing variations in loading density and variations in loading effect calculated from Equation 1, respectively, with respect to meshes along an arbitrary row of FIG. 4B. Here, the loading densities within a region having a high loading density (at the right side from line c) are constant, and likewise for the loading densities within a region having a low loading density (at the left side from line c). However, actually, there are slight fluctuations in the loading density and loading effect according to the size of a mesh. The loading effect is calculated from Equation 1. Here, a loading effect range is designated as an arbitrary value.

Then, the measured line widths (or the average of the line widths) of basic patterns of the test pattern and the calculated loading effects thereof are normalized, and the deviation between the measured line width and the calculated loading effect for each mesh can be calculated. More particularly, the loading effect calculated depending on any given loading effect range from Equation 1, and the measured line width are compared in units of meshes. By repeating the above calculation for different loading effect ranges, a loading effect range which minimizes the obtained deviations between the calculated loading effects and the measured line widths in every mesh is determined and set as a desired loading effect range.

The above-described process for obtaining a loading effect range having a minimum deviation can be simply performed in a computer program. The program starts with dividing a photomask substrate into meshes and obtaining the loading density of each of the meshes. In order to achieve this, data on test patterns and data on the arrangement of the test patterns must be input to a computer. Data on line widths measured after the test patterns are exposed to light, developed and etched also must be input to the computer. Next, an arbitrary loading effect value is selected and substituted for Equation 1, thereby obtaining the loading effect at each of the meshes. Thereafter, the deviation between the calculated loading effect and the measured line width at each mesh is obtained. A loading effect range having a minimum deviation can be obtained by a so-called least-square method. In the least-square method, a displacement is given to a firstly-selected loading effect range value, and the deviation between the calculated loading effect and the measured line width at each mesh with respect to each of the varying loading effect ranges is squared. Then, the squares at every mesh are summed, and the loading effect range which results in the minimum value among the sums is selected.

In this embodiment, a loading effect range obtained through the above process was about 11.5 mm.

Step II

Returning to FIG. 1, at Step II, the loading effect of an actual desired pattern to be formed on a photomask substrate is obtained on the basis of the loading effect range obtained from a test pattern by the above-described step.

In this step, first, the loading density of the desired pattern at each mesh on the photomask substrate is obtained. The loading density is used in the same sense as the loading density described in the above-described first step. That is, the loading density denotes a ratio of the area of a portion to be etched to have the desired pattern to the entire area of each mesh.

Next, the loading effect at each mesh on the photomask substrate is obtained from Equation 1 using the loading effect range obtained in Step I and the loading density of the desired pattern. The loading effect calculating method of Step II is similar to the method described in Step I.

Step III

Again returning to FIG. 1, during Step III, correction exposing is performed using the loading effects obtained in Step II. Through correction exposing, the variation in line width with respect to positions on a photomask substrate due to the loading effects can be reduced. For example, as shown in FIG. 5, the test patterns 110 (see FIGS. 4A and 4B) originally have the same size, but the line width of a pattern at a place having a high loading effect becomes wider than that at a place having a low loading effect during etching due to the difference between loading effects caused by peripheral patterns. Accordingly, the different line widths can be made uniform by further correction-exposing a region having a low loading effect by a degree corresponding to the difference between loading effects.

Since the difference in line width depends on the loading effect, the correction exposure can be performed on each mesh using a dose expressed as in Equation 3 considering the loading effect on the basis of a reference dose $E_0$:

$$E(x, y) = E_0 \cdot \frac{[L_u - L(x, y)]}{L_u} \quad (3)$$

wherein x, y denotes the coordinate of each mesh, and $L_u$, denotes an arbitrarily constant. Here, $L_u$ must be equal to or greater than the maximum value (for example, $L_{max}$ of FIG. 6B) among calculated loading effect values.

However, the same object can also be achieved by exposing each mesh using the invariable dose (for example, the reference dose $E_0$) instead of doses obtained from Equation 3, during the correction exposure. This exposing process can be accomplished by adjusting an area to be exposed instead of the dose. That is, a correction-exposure area $S_e$ expressed as in Equation 4 is exposed using the reference dose, which can obtain the same effect as the exposing process performed by varying a dose:

$$S_e(x, y) = S(x, y) \cdot \frac{(L_u - L(x, y))}{L_u} \quad (4)$$

wherein x,y denotes the coordinate of an arbitrary mesh, and S(x,y) denotes the area of the arbitrary mesh.

The reference dose $E_0$ can be determined as an appropriate value through an experiment, and it can be determined in consideration of a dose margin. A dose margin is expressed in units of nm/% dose, and denotes a variable representing a variation in line width with respect to a variation (%) in dose. Accordingly, when a dose margin is known, a dose for correction-exposure can be calculated by measuring a variation in line width. For example, when a dose margin is 2 nm/% dose, a dose variation of 0.5% can be given in order to give a line width variation of 1 nm. In this case, the reference dose is 0.5% of the dose of light incident before correction exposure. In order to prevent a loading effect that may be generated due to correction exposure, preferably, the reference dose is 20% or less of the dose of light incident upon the electron beam resist before correction exposure.

Figure 7:
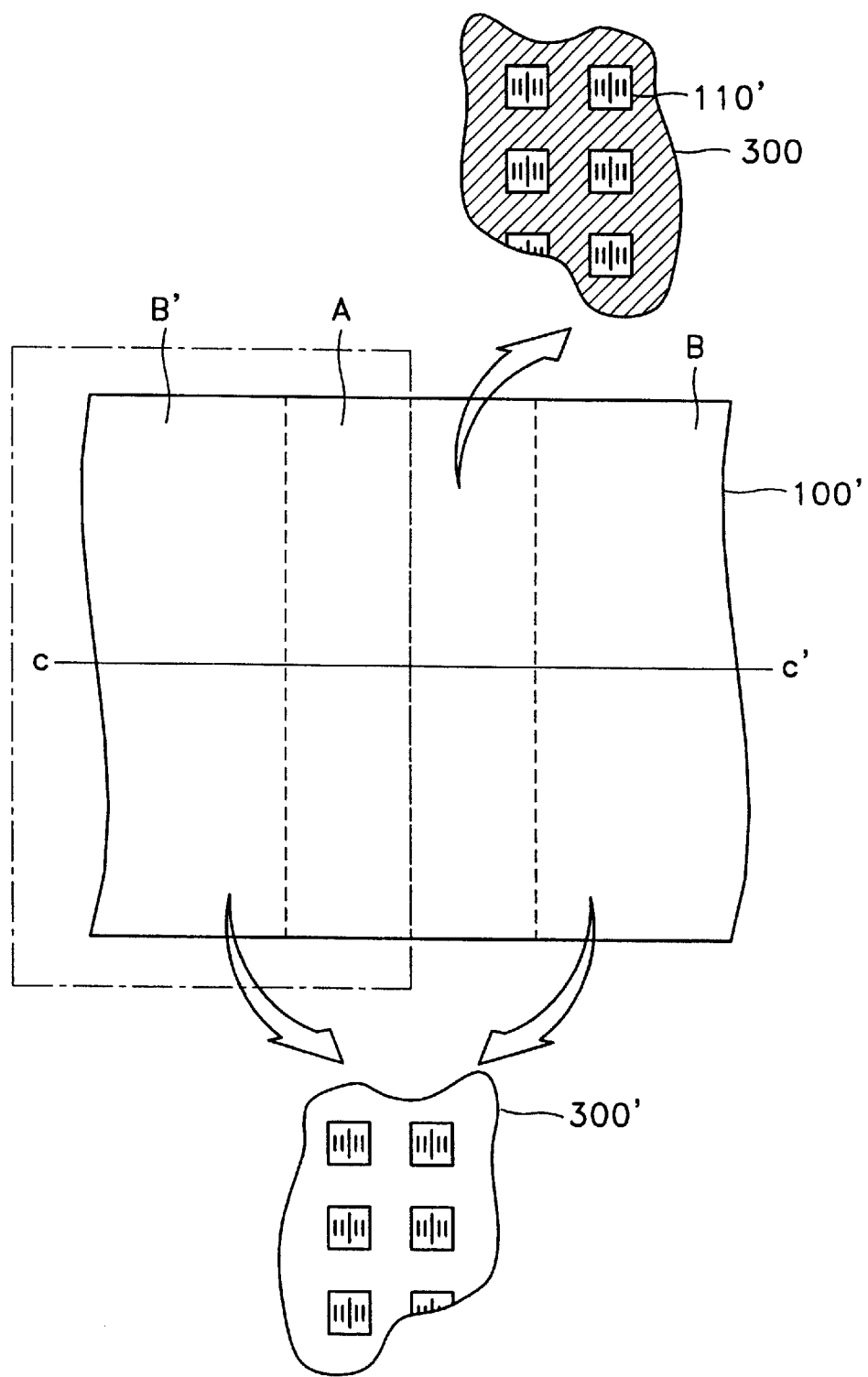
FIG. 7 shows patterns aligned on a photomask substrate to obtain a loading effect range according to an embodiment of the present invention.

An exemplary correction exposing method considering the reference dose and the loading effect will now be described. FIG. 7 shows a photomask substrate 100' on which patterns 110' are formed, and magnifications 300 and 300' of parts of the substrate, in order to explain the correction exposing method according to an embodiment of the present invention. In this embodiment, the patterns 110' are the same as the test patterns shown in FIGS. 4A and 4B, and their alignment interval is the same as the alignment interval of the test patterns. However, this embodiment is different from the case where test patterns are formed, in respect of the loading density to emphasize the effect caused by correction exposure. That is, in this embodiment, a region A having a high loading density is positioned at the center of a substrate, and regions B and B' having a low loading density are symmetrically positioned on the right and left sides of the region A. Referring to the magnifications 300 and 300' in FIG. 7, as described above, the loading density of a region in which the exterior portion of the frame of each test pattern is etched as indicated by a hatched portion is higher than that of a region in which the exterior portion of the frame of each test pattern is not etched. In this embodiment, an above-calculated value is used as a loading effect range value, and a square mesh of 1 mm×1 mm is used as a mesh to obtain a loading effect, as in the case where test patterns are formed.

A photomask substrate was primarily exposed to an electron beam of 8 $\mu$C/cm² dose according to the patterns 110'. In this embodiment, EBM-3000 of Toshiba is used as exposing equipment. This equipment is known as equipment where a variation in line width due to re-scattering of the electron beam is so extremely small as to be disregarded.

Figure 8A:
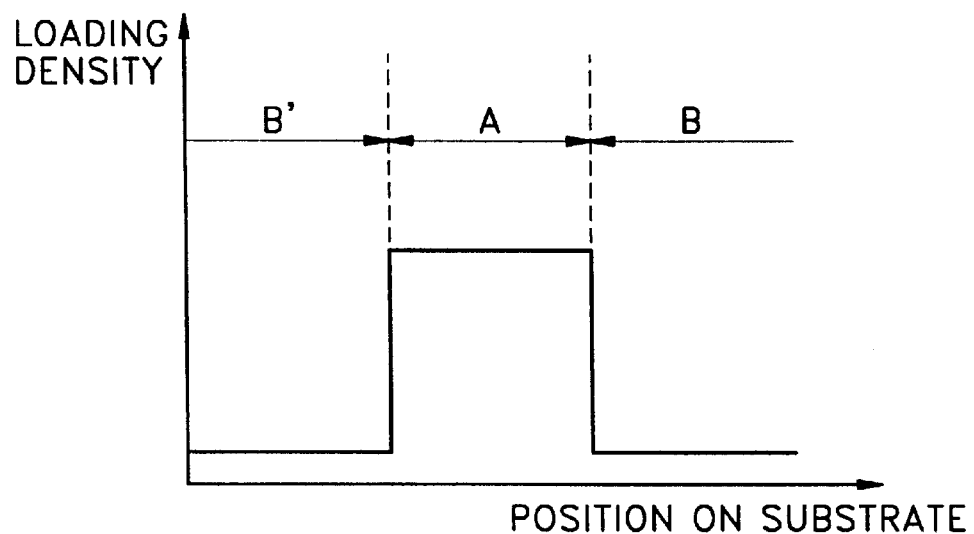
FIGS. 8A and 8B are graphs schematically showing a variation in loading density and a variation in loading effect, respectively, with respect to the meshes on a photomask substrate on which patterns are formed, to explain a correction exposure method according to an embodiment of the present invention.
Figure 8B:
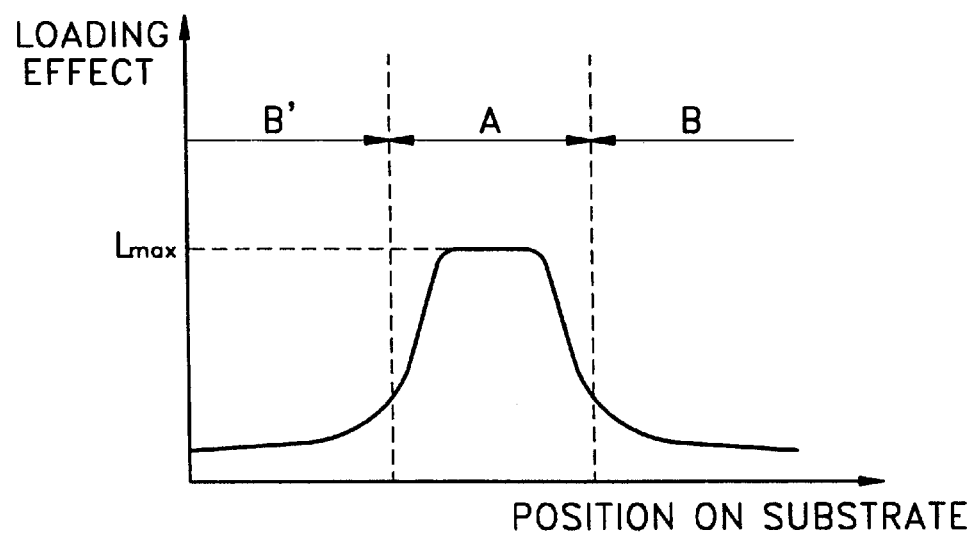

The loading effect at each mesh on a substrate can be calculated from Equation 1 using the loading density and loading effect range of the substrate. The loading density and loading effect of the substrate are obtained in direction C–C' of FIG. 7 where patterns are aligned, and schematically shown in FIGS. 8A and 8B, respectively.

Figure 9:
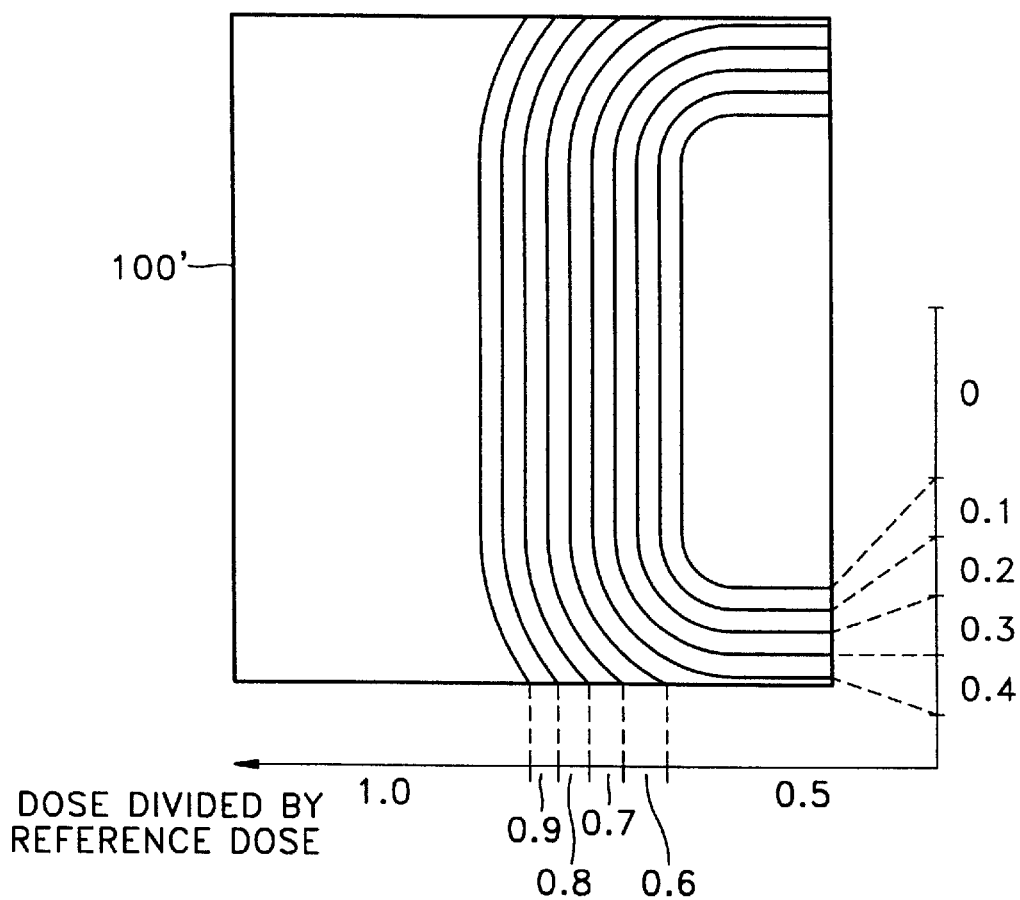
FIG. 9 illustrates the plan of a photomask substrate on which an exposure dose by sections is represented as a ratio of the area to be etched to a reference dose, in order to explain a correction exposure method according to an embodiment of the present invention.

In an experimental embodiment, only the left side from the center of the photomask substrate was correction-exposed according to Equation 3 with 0.32 $\mu$ C/cm$^2$ dose, which is 4% of the primary exposure dose, set as the reference dose. Here, $L_u$ in Equation 3 is the maximum loading effect value $L_{max}$ of FIG. 8B. A region B having a low loading density at the right portion of the photomask substrate was not correction-exposed for the comparison with a region B' having a low loading density at the left portion of the photomask substrate. Here, each mesh should be exposed using a different dose depending on loading effect values, but each mesh was exposed by dose sections in consideration of the performance of exposing equipment and the exposure time. That is, the range between the maximum and minimum loading effect values is divided into 10 sections, and each of the ten sections was exposed at each of doses into which the reference dose is divided in the same manner. The two-dimensional distribution of exposure doses to which a photomask substrate was exposed by the above-described method is shown in FIG. 9. The plane shown in FIG. 9 corresponds to an area of the photomask substrate 100' of FIG. 7, which is enclosed by a one-dot-dashed line. In FIG. 9, the axis shown outside the photomask substrate 100' represents exposure doses divided by the reference dose.

As described above, the correction exposing can be performed by adjusting an exposure area depending on a mesh to be exposed, without varying the correction exposure dose. For example, in an exposure section where exposure is set to be made at a dose of 0.32 $\mu$ C/cm$^2$, the entire area of a mesh is exposed at a dose of 0.32 $\mu$ C/cm$^2$. In the next section, 90% of the area of a mesh is exposed at the same dose. In this method, the correction exposing process can be performed by pre-setting a correction exposure pattern depending on an exposure area of each mesh in exposing equipment and using a computer program based on the data of the preset correction exposure patterns. This process is disclosed in Korean Patent Application No. 00-1337 by the present applicant, and incorporated herein by reference.

Figure 10:
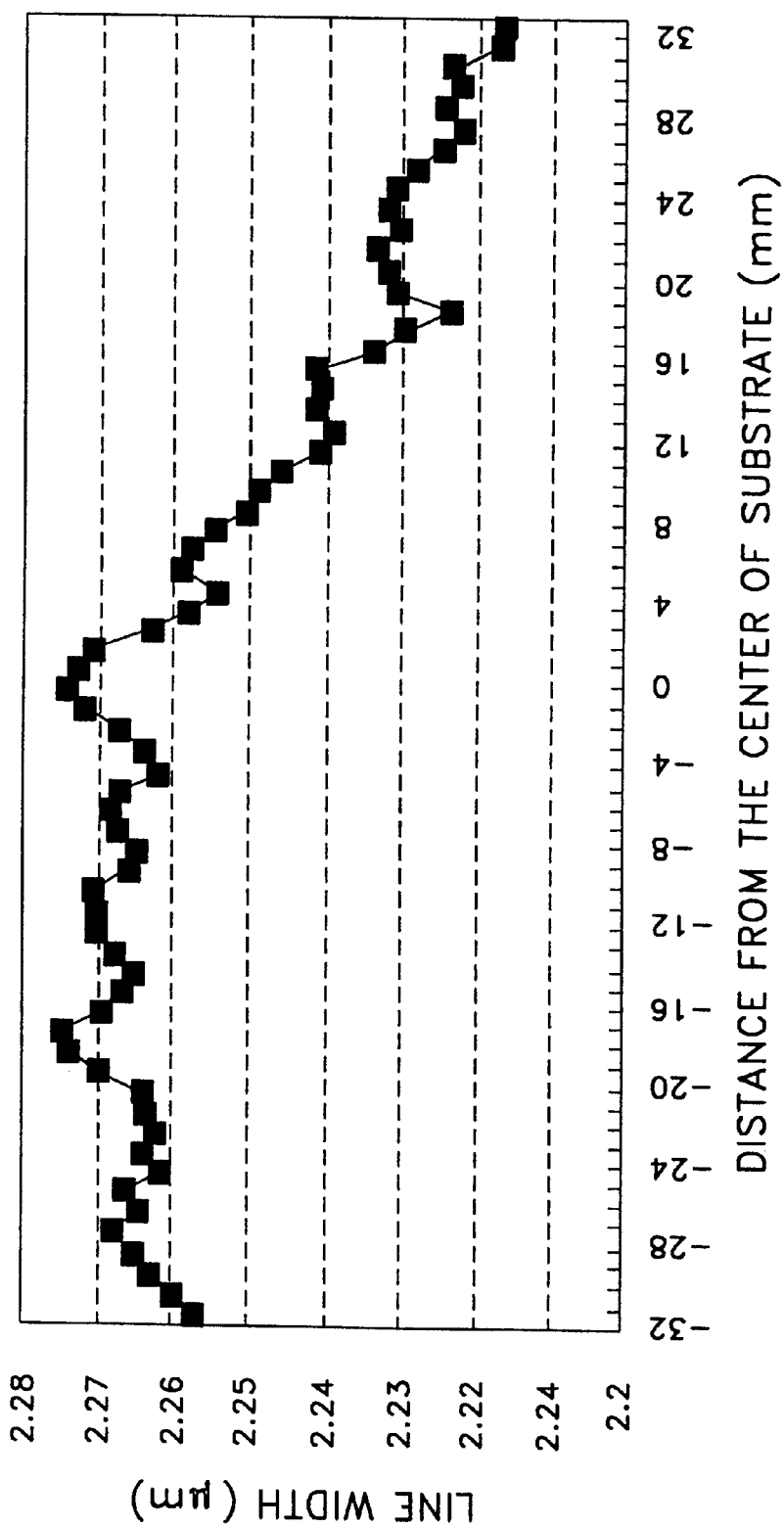
FIG. 10 is a graph showing variations in the line width of patterns on a photomask substrate developed and etched through correction exposure according to the present invention.

The line widths of patterns on a photomask substrate developed and etched after the correction exposure are shown in FIG. 10. Referring to FIG. 10, in a case of a correction-exposed area on a photomask substrate, at the left side, the maximum line width among measured line widths is about 2.27 $\mu$m, and the minimum line width is about 2.26 $\mu$m, so that the difference between the two line widths is about 17 nm. However, in a case of a non-correction-exposed area of the photomask substrate, at the right side, the difference between the maximum line width (2.27 $\mu$m) and the minimum line width (2.22 $\mu$m) is relatively large. Accordingly, in this embodiment, correction exposure is performed according to loading effect values calculated from Equation 1, so that a variation in line width can be compensated for.

The above-described method of correcting a variation in line width due to different loading effect values, according to the present invention, can be achieved using a program which can be read from a recording medium and executed by a computer. Also, the recording medium can be executed by a general purpose digital computer. Accordingly, the recording medium is executed by a digital computer attached to the exposing equipment so that the present invention is more easily performed. The recording medium may be a magnetic storage medium (for example, ROM, floppy discs, hard discs, etc.), an optical reading medium (for example, CD-ROM, DVD, etc.), or a carrier wave (for example, transmission through Internet).

The recording medium includes a program module for obtaining a loading effect range, a program module for obtaining a loading density, and a program module for obtaining a loading effect. In the program module for obtaining a loading effect range, a photomask substrate is divided into meshes as described above, a loading effect at each mesh on the substrate to have an arbitrary pattern is repeatedly calculated from Equation 1, the calculated loading effects are compared with line widths formed by exposing, developing and etching each mesh to have the arbitrary pattern, and finally a loading effect range is obtained in which the deviation between a loading effect and a line width is a minimum. Also, the program module for obtaining a loading density calculates the loading density of each mesh having a desired pattern to be actually formed on a photomask substrate. The program module for obtaining a loading effect, which performs calculation with respect to a desired pattern using Equation 1, receives the above-calculated loading effect range and the loading density data of the desired pattern, and obtains the loading effect at each mesh on a photomask substrate.

The recording medium can also include a program module for calculating a correction exposure dose for correcting a variation in line width due to the loading effect of the desired pattern. The correction exposure dose for each mesh is calculated using the relationship given by Equation 3 from the loading effect of the desired pattern. Here, the reference dose and the loading effect in Equation 3 can be separately provided from an external source or given through calculation using Equation 1.

As described above, since the recording medium includes a program module for calculating a correction exposure dose, it is preferably mounted on a computer which operates exposing equipment, so that it generates correction exposure data required by the exposing equipment. Thus, the recording medium can be used to operate the exposing equipment.

The above-described program module for obtaining a loading effect range also includes, in respect of the operation of exposing equipment, a sub-program module which generates a predetermined exposure pattern for obtaining a loading effect range and obtains the loading density according to the exposure pattern, a sub-program module which exposes a photomask substrate by operating exposing equipment to obtain the generated exposure pattern, a sub-program module which receives the data of measured line width formed by developing and etching the exposed pattern, and a sub-program module which obtains the loading effects of the exposure pattern using Equation 1 and also obtains an optimal loading effect range by comparing the loading effects with the measured line widths. Therefore, the exposing equipment can be more efficiently operated.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of correcting for variation in line width due to a loading effect generated when the material layer on a photomask substrate is dry-etched to have a desired pattern, the method comprising:

obtaining a loading effect range $\delta$ by dividing the substrate into meshes, and supposing the distribution of a loading effect frequency $f_L$ representing the degree of a loading effect at an arbitrary mesh on the substrate from each of other meshes to be a Gaussian distribution expressed according to the relationship $$f_L(r) = \frac{k}{\pi\delta^2} \cdot \exp\left[-\frac{r^2}{\delta^2}\right]$$

wherein r denotes the distance between the arbitrary mesh and each of the other meshes, and k denotes a loading constant;

calculating the loading density of the desired pattern, which is defined as a ratio of the area to be etched to the area of each mesh;

calculating the loading effect at each of the meshes on the substrate by convolving the loading density and loading effect frequency at all of the meshes on the substrate; and correction-exposing an electron beam resist according to the loading effect calculated at each of the meshes on the substrate.

2. The method of claim 1, wherein the step of obtaining a loading effect range comprises:

forming test patterns by exposing, developing and etching a photomask substrate, and measuring the line width of the test pattern;

dividing the test patterns by meshes, and calculating the loading density of test patterns which is defined as a ratio of an area to be etched to the area of each mesh; and calculating the loading effect of the test pattern at each mesh from an arbitrary loading effect range value according to the relationship $$L(x, y) = \sum_{i,j} D(i, j) \cdot \exp\left[-\frac{(x-i)^2 + (y-j)^2}{\delta^2}\right]$$

comparing the loading effects with the line widths of the test pattern at the meshes, and selecting a loading effect range in which the deviation between them is minimum; wherein x,y denotes the coordinate of the arbitrary mesh, and D(i,j) denotes the loading density of the test patterns in a mesh having a coordinate (i,j).

3. The method of claim 2, wherein the step of selecting a loading effect range comprises:

(a) selecting an arbitrary loading effect range;
(b) calculating the loading effect of each of the meshes from the relationship for obtaining the loading effect;
(c) obtaining the deviation between the measured line width at each mesh and the calculated loading effect at each mesh; and
(d) repeating steps (a) through (c) and selecting a loading effect range in which the deviation between the measured line width and the calculated loading effect is at a minimum.

4. The method of claim 3, wherein the minimum deviation in step (d) is determined by a least square method.

5. The method of claim 1, wherein the loading effect L in the loading effect calculation step is determined according to the relationship:

$$L(x, y) = \sum_{i,j} D(i, j) \cdot \exp\left[-\frac{(x-i)^2 + (y-j)^2}{\delta^2}\right]$$

wherein x,y denotes the coordinate of the arbitrary mesh, and D(i,j) denotes the loading density of the desired patterns in a mesh having a coordinate (i,j).

6. The method of claim 1, wherein the correction exposing step is performed using the dose for each mesh determined depending on the loading effect L with respect to a reference dose $E_O$ by the following relationship:

$$E(x, y) = E_0 \cdot \frac{[L_u - L(x, y)]}{L_u}$$

wherein x, y denotes the coordinate of the arbitrary mesh, and $L_u$ denotes an arbitrarily loading effect value that is equal to or greater than the calculated maximum loading effect value.

7. The method of claim 6, wherein the correction exposing step is performed by exposing an area $S_e$ of the entire surface S of the arbitrary mesh with the constant reference dose $E_O$ the area $S_e$ expressed as in the relationship:

$$S_e(x, y) = S(x, y) \cdot \frac{(L_u - L(x, y))}{L_u}$$

wherein x,y denotes the coordinate of the arbitrary mesh.

8. The method of claim 6, wherein the arbitrary loading effect value $L_u$ is the calculated maximum loading effect value.

9. The method of claim 7, wherein the reference dose is determined to be 20% or less of an exposure dose incident upon the electron beam resist before the correction exposing step.

10. A recording medium readable by a computer that records a method of correcting a variation in line width due to a loading effect generated when the material layer on a photomask substrate is dry-etched to have a desired pattern, the recording medium comprising:

a program module for obtaining a loading effect range δ by dividing a predetermined pattern into meshes, calculating a loading effect L for each of the meshes with respect to arbitrary loading effect range values δ and comparing the loading effect with a given line width, the loading effect L expressed as in the following relationship:

$$L(x, y) = \sum_{i,j} D(i, j) \cdot \exp\left[-\frac{(x-i)^2 + (y-j)^2}{\delta^2}\right]$$

wherein x,y denotes the coordinate of an arbitrary mesh, and D(i,j) denotes the loading density of the patterns in a mesh having a coordinate (i,j);

a program module for calculating the loading density of the desired pattern, which is defined as a ratio of the area to be etched to the area of each mesh;

a program module for receiving the loading effect range δ and data of the loading density of the desired patterns and calculating the loading effect L of the desired pattern loaded on each of the meshes using the above relationship for obtaining a loading effect; and a program module for calculating a correction-exposing dose for each of the meshes from the loading effect of the desired pattern.

11. The recording medium of claim 10, wherein the program module for obtaining the loading effect range δ comprises:

a sub-program module for dividing test patterns by meshes and obtaining the loading density of the test patterns in each of the meshes;

a sub-program module for receiving the data of the measured line width of an actual pattern formed by etching each of the meshes after the test pattern; and a sub-program module for obtaining the loading effect of the test pattern at an arbitrary mesh from all of the meshes using the equation for obtaining a loading effect, comparing the loading effects with the input line width data, and obtaining a loading effect range δ in which the deviation between the loading effect and the line width is minimum.

12. The recording medium of claim 11, wherein the sub-program module for obtaining a loading density comprises a sub-program module for producing the test pattern and exposing the photomask substrate in accordance with the test pattern.

13. The recording medium of claim 11, wherein the loading effect range in which the deviation between the loading effect and the line width is minimum is selected by a least square method.

14. The recording medium of claim 10, further comprising a program module for exposing the electron beam resist on the photomask substrate by operating exposing equipment according to the data of calculated exposure doses for the desired pattern.

15. The recording medium of claim 14, wherein the program module for exposing the electron beam resist on the photomask substrate further comprises a sub-program module for setting a correction exposure pattern for each mesh using a correction exposure pattern predetermined to expose an area proportional to a correction exposure dose for each mesh with the constant reference dose.

* * * * *